United States Patent
Lugiez et al.

(10) Patent No.: US 9,257,950 B2
(45) Date of Patent: Feb. 9, 2016

(54) CHARGE PREAMPLIFIER

(71) Applicant: COMMISSARIAT A L'ENERGIE ATOMIQUE ET AUX ENERGIES ALTERNATIVES, Paris (FR)

(72) Inventors: Francis Lugiez, Bagneux (FR); Olivier Gevin, Palaiseau (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/340,278

(22) Filed: Jul. 24, 2014

(65) Prior Publication Data

US 2015/0028950 A1 Jan. 29, 2015

(30) Foreign Application Priority Data

Jul. 24, 2013 (FR) ..................................... 13 57291

(51) Int. Cl.
*H03F 1/02* (2006.01)
*H03F 3/70* (2006.01)
*H03F 3/45* (2006.01)

(52) U.S. Cl.
CPC .............. *H03F 3/70* (2013.01); *H03F 3/45475* (2013.01); *H03F 2200/372* (2013.01)

(58) Field of Classification Search
CPC ........................................................ H03F 1/02
USPC .................................................. 330/9, 85, 94
See application file for complete search history.

(56) References Cited

U.S. PATENT DOCUMENTS

| 4,760,345 | A | 7/1988 | Büsser et al. | |
| 7,271,649 | B2 * | 9/2007 | Chiu et al. | 330/9 |
| 8,299,850 | B1 * | 10/2012 | Kutz et al. | 330/9 |
| 8,514,014 | B2 * | 8/2013 | Murphy et al. | 330/9 |
| 2013/0161492 | A1 | 6/2013 | Han et al. | |

FOREIGN PATENT DOCUMENTS

| EP | 1 460 402 | 9/2004 |
| WO | WO 2005/036738 | 4/2005 |

OTHER PUBLICATIONS

Search Report and Written Opinion issued for French Patent Application No. 1357291, dated Mar. 14, 2014.

* cited by examiner

*Primary Examiner* — Henry Choe
(74) *Attorney, Agent, or Firm* — Pillsbury Winthrop Shaw Pittman LLP

(57) ABSTRACT

A charge preamplifier for converting an electric charge generated in a charge source sensor into a voltage signal, including: a phase inverting amplifier including an input related to the charge source sensor, and an output for providing the voltage signal; a storage capacitor connected between the input and the output of the phase inverting amplifier; a reset system connected to the input of the phase inverting amplifier, for providing to the storage capacitor a discharging current as a function of a control signal, and a control element including: a first input connected to the output of the phase inverting amplifier, for withdrawing the voltage signal, a second input subjected to a reference voltage, a set of components configured and arranged to generate a control signal proportional to the deviation between the voltage signal and the reference voltage, the proportionality coefficient being lower than one in a high frequency band, an output connected to the reset system to provide thereto the control signal.

8 Claims, 3 Drawing Sheets

CHARGE PREAMPLIFIER

CROSS-REFERENCE TO RELATED APPLICATIONS

This application claims priority to French Patent Application No. 1357291, filed Jul. 24, 2013, the entire content of which is incorporated herein by reference in its entirety.

FIELD

The technical field of the invention is that of charge source sensors. The present invention relates to a charge preamplifier for converting an electric charge generated in a charge source sensor into a voltage signal.

BACKGROUND

A sensor is generally followed by a conditioner ensuring the conversion of an electrical magnitude at the output of the sensor into an exploitable electrical magnitude, generally a voltage. In the case of physical measurements using a sensor delivering an electric charge under the effect of a signal to be measured, also called "charge source sensor", such as a piezo-electric sensor, the suitable conditioner is a charge preamplifier.

In reference to FIG. 1, a charge preamplifier includes a phase inverting amplifier AI, herein of the operational type, and a capacitor $C_m$, called a "storage capacitor", collecting the charge delivered by the sensor CAP. The sensor CAP is represented by a charge source $q_c$. More precisely, the operational amplifier AI includes an inverting input terminal connected to an output of the sensor CAP, and a non-inverting input terminal connected to a reference voltage. The storage capacitor $C_m$ is placed between the inverting input terminal and the output terminal of the operational amplifier AI. It is noted that the phase inverting amplifier AI could also be of the transconductance type. The measurement of the voltage at the terminals of the storage capacitor $C_m$ is proportional to the charge quantity $q_c$ generated by the sensor CAP, and independent of the capacitance of the sensor CAP and the connecting cables.

Discharging, also called "reset", of the storage capacitor storing the electric charge delivered by the sensor, can be made permanently or in a pulse way, periodic or not, using a reset system placed in a feedback loop of the charge amplifier. It is noted that it is important to avoid the saturation of the operational amplifier and to keep a sufficient dynamic range.

In the case of a permanent reset, it is known to use a reset system including a resistance placed in parallel with the storage capacitor, enabling the storage capacitor to be discharged. The value of the resistance should be selected very high to reduce the noise it supplies. Indeed, the sensor has generally a leakage current $I_{det}$ depending on parameters such as temperature, electric bias conditions of the sensor, irradiation doses received, etc. This leakage current generates a shot noise of variance $2qI_{det}$, where q is the elementary charge of an electron. If the resistance has a value equal to $2 kT/(q \cdot I_{det})$, that is 52 MOhms for 1 nA, the power of the shot noise is doubled.

But, a resistance of this order of magnitude is not feasible as a pure passive resistance for reasons of a size unsuitable for integrated circuits. In reference to FIG. 2, SRZ active components biased at very low currents are conventionally used, to replace the resistance. The SRZ active component generates a discharging current $i_d$ controlled by the variations in the output voltage $V_{sPAC}$ of the operational amplifier AI. In the embodiment of FIG. 2, the SRZ active component is a MOS transistor, equivalent to a voltage controlled current generator. The discharging current $i_d$ is controlled by the deviation between the output voltage $V_{sPAC}$ and a reference value $V_{ref}$, corresponding to the output voltage at rest of the charge preamplifier. The discharging current $i_d$ delivered by the SRZ active component supplies the storage capacitor $C_m$ with a charge opposite to the charge generated by the signal and stored in the storage capacitor $C_m$.

However, the active element adds noises to the measure. Indeed, the noise of an active element directly depends on the current passing through it. In static operation, that is in the absence of a signal, these noises depend on active element bias currents, which are minimized to restrict the noise source. But in dynamic operation, that is after the arrival of a signal, as soon as the electric charge corresponding to the signal has started to be stored in the storage capacitor, the active component is activated and the discharging current it provides at the input of the charge preamplifier increases. This discharging current reaches a maximum value substantially at the same time as the charge stored in the storage capacitor, possibly slightly later if the corresponding electrical path is slower than the charging circuit of the storage capacitor. The current passing through the active element thus changes from a low rest value to a much higher value required for discharging the storage capacitor. This transient current is a noise source the variance of which increases with the amplitude of said current. A low noise reset system can thus be made in the absence of a signal, but it is not possible to hold this property upon measuring a signal.

But, this noise induces a further fluctuation in the signal measurement and this fluctuation is all the more important that the discharging current maximum is close to the time of arrival of the signal at the input of the charge amplifier.

SUMMARY

An aspect of the invention provides a charge preamplifier enabling this noise to be restricted.

According to a first aspect, the invention substantially relates to a charge preamplifier for converting an electric charge generated in a charge source sensor into a voltage signal, including:
  a phase inverting amplifier including an input related to the charge source sensor,
  a storage capacitor connected between the input and an output of the phase inverting amplifier,
  a reset system connected to the input of the phase inverting amplifier, for providing to the storage capacitor a discharging current as a function of a control signal.

Further, the charge preamplifier includes a control element connected between the reset system and the output of the phase inverting amplifier, and suitable for providing the control signal to the reset system, said control signal being proportional to the deviation between the output voltage of the phase inverting amplifier and a reference voltage, said proportionality coefficient being lower that one for high frequencies.

In other words, the control element includes:
  a first input connected to the output of the phase inverting amplifier, for withdrawing the voltage signal
  a second input subjected to a reference voltage
  a set of components configured and arranged to generate a control signal proportional to the deviation between the voltage signal and the reference voltage, said proportionality coefficient being lower than one in a high frequency band an output connected to the reset system to provide thereto the control signal.

By "the control signal is proportional to the deviation between the voltage signal and the reference voltage, said proportionality coefficient being lower than one in a high frequency band", it is meant that the control signal is such that:

$$Sg=\alpha(VsPAC-Vref)$$

Where:
Sq is the control signal
VsPAC is the voltage signal
Vref is the reference voltage
$\alpha$ is a proportionality coefficient depending on the frequency
$\alpha<1$ in a high frequency band.

In other words, the control element behaves as an attenuator of the difference between the voltage signal and the reference voltage in a high frequency band.

Besides the mains characteristics just mentioned in the preceding paragraph, the device according to an embodiment of the invention can have one or more further characteristics among the following ones, considered singly or according to the technically possible combinations:
 the proportionality coefficient is higher than one for low frequencies. In other words, the control element behaves as an amplifier of the difference between the voltage signal and the reference voltage at low frequencies.
 the control element includes a modified transconductance amplifier including:
  a resistive element
  a first field effect transistor of a first type, the gate and the drain of the first transistor being connected with each other
  a second field effect transistor of the same type as the first transistor, the sources of the first transistor and the second transistor being at a same fixed potential, the gates of the first transistor and the second transistor being connected via the resistive element
  a capacitor connected between the gate and the drain of the second transistor
 the resistive element includes a second transconductance amplifier, biased by a low current
 the control element includes:
  a D.C. current source
  a third field effect transistor of a complementary type t the first transistor, such that:
   the drain of the third transistor is connected to the drain of the first transistor
   the source of the third transistor is connected to the current source
   the gate of the third transistor is subjected to the output voltage of the phase inverting amplifier
  a fourth field effect transistor of a complementary type to the first transistor, such that:
   the drain of the fourth transistor is connected to the drain of the second transistor
   the source of the third transistor is connected to the current source
   the gate of the third transistor is subjected to the reference voltage.
 the control element includes:
  an operational amplifier, including:
   a non-inverting terminal subjected to the voltage signal
   an inverting terminal subjected to the reference voltage
   an output connected to a passive network
  the passive network including:
   a first resistance, including a first terminal connected to the output of the operational amplifier, and a second terminal at which the voltage signal is withdrawn
   a second resistance, including a first terminal connected to the second terminal of the first resistance, and a second terminal
   a third resistance including a first terminal connected to the second terminal of the second resistance, and a second terminal subjected to a zero voltage
   a second capacitor, connected in parallel with the second resistance.
 the reset system includes a field effect transistor the source of which is subjected to the control signal.
 the reset system includes a bipolar transistor the emitter of which is subjected to the control signal.
 the reset system is biased by a leakage current of the sensor.

By "type" of transistor, it is meant a N-channel or P-channel transistor. A N-channel transistor and a P-channel transistor are said to be of a complementary type.

The invention and its different applications will be better understood upon reading the following description and examining the accompanying figures.

BRIEF DESCRIPTION OF THE FIGURES

The figures are only presented by way of indicating and in no way limiting purposes for the invention.

The figures show.

DETAILED DESCRIPTION

Figure 3:
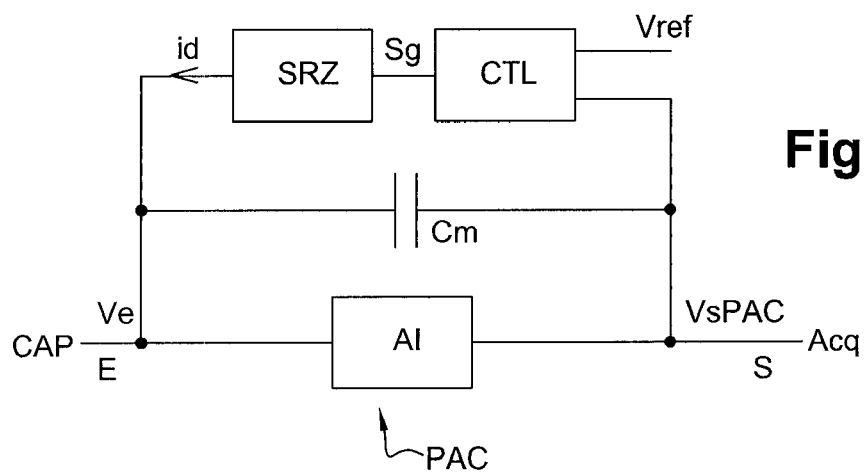

FIG. 3 shows a charge preamplifier PAC according to an embodiment of the invention. The charge preamplifier PAC includes an input E connected to an output of a charge source sensor CAP, and an output S connected to a voltage acquisition device ACQ.

The charge preamplifier PAC includes:
 a phase inverting amplifier AI including:
  an input related to the input E of the charge preamplifier PAC, which is related to the charge source sensor CAP
  an output related to the output S of the charge preamplifier PAC, which is related to the voltage acquisition device ACQ, to provide a voltage signal $V_{sPAC}$
 a storage capacitor $C_m$ including:
  a first terminal connected to the input E of the charge preamplifier PAC
  a second terminal connected to the output S of the charge preamplifier PAC a reset system SRZ including:
an output connected to the input E of the charge preamplifier PAC,
an input connected to a control element CTL
the control element CTL including:
an output connected to the input of the reset system SRZ to provide thereto a control signal Sg
a first input connected to the output S of the charge preamplifier PAC, for withdrawing the voltage signal $V_{sPAC}$
a second input subjected to a reference voltage $V_{ref}$.

Figure 1:
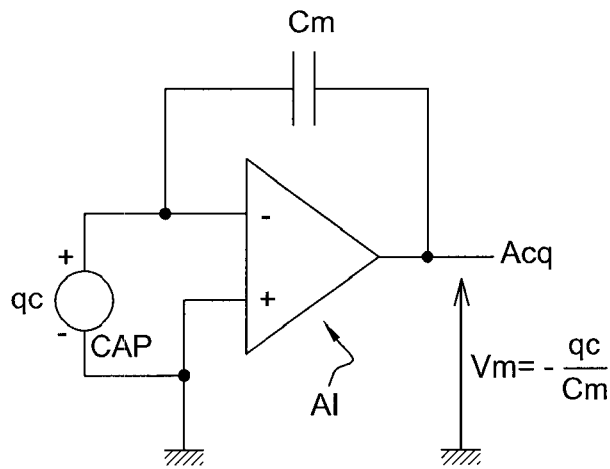
in FIG. 1, already described, a charge preamplifier according to prior art,
 in FIG. 2, already described, a charge preamplifier with a reset function according to prior art
 in FIG. 3, a charge preamplifier with a reset function, according to one embodiment of the invention
 in FIG. 4, a control system and a control element ensuring a reset function, according to a first embodiment of the invention
 in FIG. 5, a Bode diagram of the control element of FIG. 4
 in FIG. 6, a control element according to a second embodiment of the invention
 in FIG. 7, a Bode diagram of the control element of FIG. 6.
Figure 2:
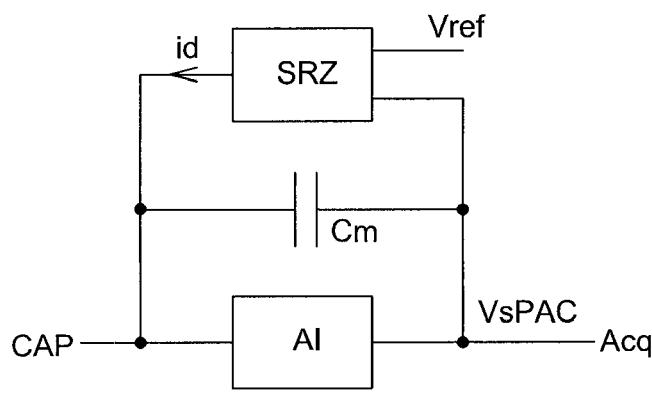

As previously described, the phase inverting amplifier AI is of the operational type (see FIG. 1) or of the transconductance type. The storage capacitor $C_m$, feedback connected between the input E and the output S of the phase inverting amplifier, forms a Miller integrator. The reset system SRZ provides a discharging current $i_d$ to the storage capacitor $C_m$. In an embodiment, the reset system SRZ is made using transistors. Finally, the control element CTL regulates the output voltage $V_{sPAC}$ of the phase inverting amplifier AI to the reference voltage $V_{ref}$.

The control element CTL includes a set of components configured and arranged to generate a control signal Sg which is proportional to the deviation between the voltage signal $V_{sPAC}$ and the reference voltage, the proportionality coefficient being dependent on the frequency and being lower than one in a high frequency band. Beneficially, the proportionality coefficient is further higher than one at low frequencies.

Figure 4:
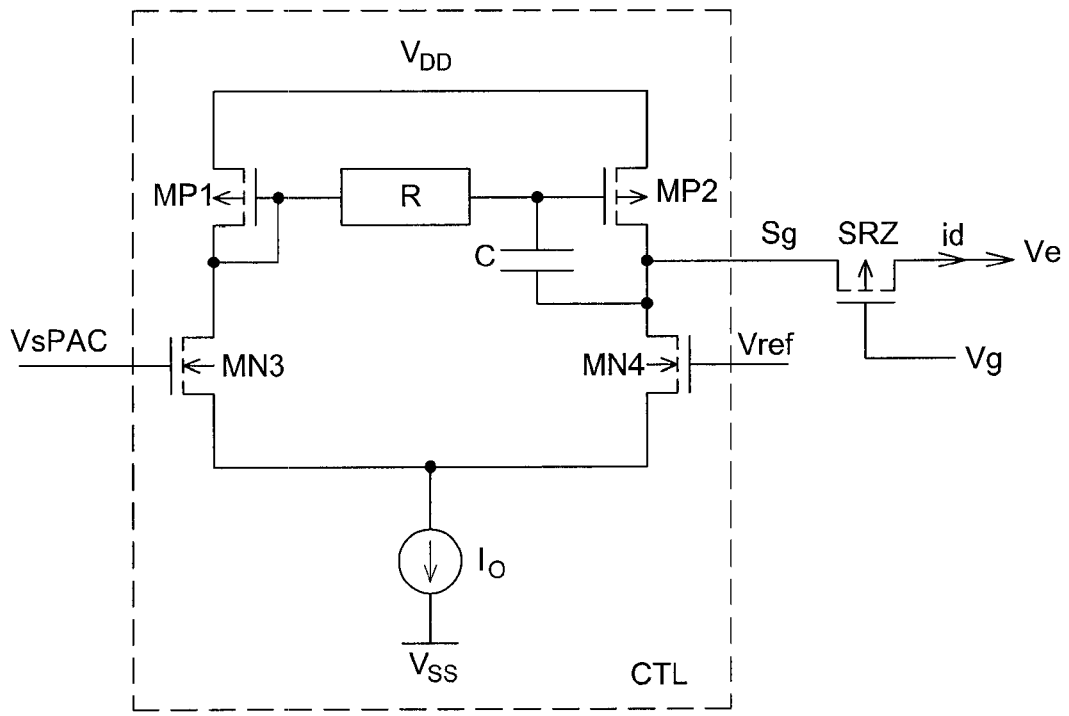

FIG. 4 shows a first embodiment of a reset system SRZ and of a control element CTL according to the invention.

The reset system SRZ is in the present case a P-channel MOSFET transistor, connected as a common gate. In another embodiment, the reset system SRZ is a P-channel or N-channel MOSFET transistor connected as a common source. In another embodiment, the reset system SRZ is a NPN or PNP bipolar transistor, connected as a common emitter. In another embodiment, the reset system SRZ is a NPN or PNP bipolar transistor, connected as a common base.

In a described embodiment, the reset system SRZ is biased by the leakage current of the sensor CAP, present at the input of the charge preamplifier PAC. In another embodiment, the reset system SRZ is biased by a dedicated current source.

The reset system SRZ provides a discharging current $i_d$ controlled by a control signal Sg provided by the control element CTL.

In the embodiment of FIG. 4, the control element CTL is a modified transconductance amplifier using a resistance-capacitance network. More precisely, the transconductance amplifier includes:
a D.C. current source $I_0$
a first P-channel field effect transistor MP1
a second P-channel field effect transistor MP2
a third N-channel field effect transistor MN3
a fourth N-channel field effect transistor MN4
a resistive element R
a capacitor C.

It will be appreciated that the operation would not be modified if transistors were differently chosen. Indeed, the first transistor MP1 and the second transistor MP2 could be of the N-channel type; the third transistor MN3 and the fourth transistor MN4 would then be of the P-channel type. Indeed, it is sufficient that both groups of transistors be of a complementary type.

The first transistor MP1 and the second transistor MP2 are connected as a modified current mirror:
the gate and the drain of the first transistor MP1 are connected to each other the source of the first transistor MP1 and the source of the second transistor MP2 are at a same fixed potential $V_{DD}$
the gate of the first transistor MP1 and the gate of the second transistor MP2 are connected through the resistive element R. It is noted that the resistive element R isolates the first transistor MP1 from the second transistor MP2, whereas they are connected in a conventional current mirror connection
the drain of the first transistor MP1 is connected to the current source through the third transistor MN3
the drain of the second transistor MP2 is connected to the current source through the fourth transistor MN4
the gate and the drain of the second transistor MP2 are connected through the capacitor C.

More precisely:
the drain of the third transistor MN3 is connected to the drain of the first transistor MP1
the source of the third transistor MN3 is connected to the current source $I_0$
the drain of the fourth transistor MN4 is connected to the drain of the second transistor MP2
the source of the fourth transistor MN4 is connected to the current source $I_0$.

Further:
the gate of the third transistor MN3 is subjected to the output voltage $V_{sPAC}$ of the phase inverting amplifier AI
the gate of the third transistor MN3 is subjected to the reference voltage $V_{ref}$.

Figure 5:
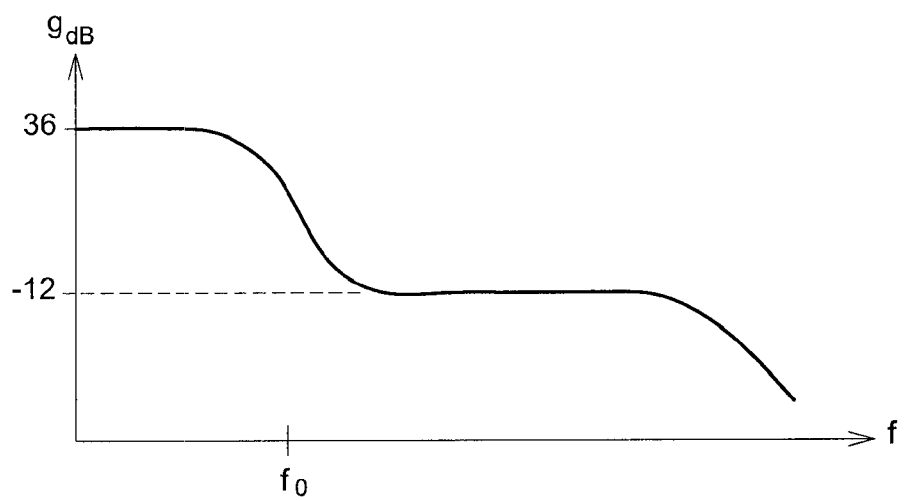

Thus, the voltage at the output of the transconductance amplifier is proportional to the deviation between the output voltage $V_{sPAC}$ of the phase inverting amplifier AI, and the reference voltage $V_{ref}$. The voltage at the output of the transconductance amplifier is the control signal Sg applied to the reset system SRZ. But the proportionality coefficient varies as a function of the frequency, as shown in the Bode gain diagram of the control element CTL, represented in FIG. 5.

At low frequencies, that is in static mode, that is in the absence of detection, the gain $g_{dB}$ of the control element is high. In the present case, it is 36 decibels. Then, from a certain frequency $f_0$, the gain $g_{dB}$ drops before being restored to a value lower than one, in the present case −12 decibels. The control element CTL thus behaves as a low frequency amplifier, and as an attenuator in a higher frequency band.

Indeed, at low frequencies, the capacitor C is equivalent to an open circuit, whereas at high frequencies, the capacitor C is equivalent to a closed circuit. At high frequencies, the gate and the drain of the second transistor MP2 are thus at the same potential. The second transistor MP2 thus behaves as a charge resistance having a known and controllable value by setting the current $I_0$ output from the current source.

It is noted that from a certain frequency, the gain drops again: this is due to the presence of stray capacitances not represented in the figure and to the mobility limits of the charge carriers in the materials of the transistors.

The amplifier and attenuator behaviour as a function of the frequencies is advantageous. Indeed, a high gain $g_{dB}$ allows a better accuracy for regulating the voltage $V_{sPAC}$ at the output of the phase inverting amplifier AI. Further, a low gain $g_{dB}$ enables the current $i_d$ peak to be restricted at the output of the reset system SRZ.

More precisely, after the arrival of a signal from the sensor CAP, to ensure a discharge of the storage capacitor $C_m$, which restricts the transient noise, the control element CTL provides the reset system SRZ with a fraction of the deviation between the output voltage $V_{sPAC}$ of the phase inverting amplifier AI and the reference voltage $V_{ref}$. The control element CTL thus acts as a voltage attenuator, which restricts the maximum value reached by the discharging current $i_d$ with respect to the situation of prior art wherein the deviation between the output voltage $V_{sPAC}$ of the inverting amplifier and the reference voltage $V_{ref}$ is directly applied with a gain equal to or higher than one. Further, to ensure a sufficient accuracy for statically regulating the voltage at the output $V_{sPAC}$ of the phase inverting amplifier AI, that is to make sure that the output voltage $V_{sPAC}$ of the phase inverting amplifier AI is close to the reference voltage $V_{ref}$ in the absence of detection, the gain of the control element CTL at low frequencies increases when the frequency decreases.

The control element CTL thus allows:
- the output voltage $V_{sPAC}$ of the phase inverting amplifier AI to be controlled to be close to the reference voltage $V_{ref}$ in static mode
- the current $i_d$ provided by the reset system SRZ to be controlled in order to restrict it in dynamic mode.

The control element CTL thus enables the output voltage $V_{sPAC}$ of the phase inverting amplifier AI to be regulated to a reference voltage $V_{ref}$ which, after the arrival of the signal, ensures the return to the reference voltage $V_{ref}$ by reducing the noise inseparable from this operation.

It will be appreciated that there are a vast number of electronic connections enabling a control element CTL to be made including:
- a first input connected to the output S of the phase inverting amplifier AI, for withdrawing the voltage signal $V_{sPAC}$
- a second input subjected to a reference voltage $V_{ref}$
- a set of components configured and arranged to generate a control signal Sg proportional to the deviation between the voltage signal $V_{sPAC}$ and the reference voltage $V_{ref}$, said proportionality coefficient being lower than one in a high frequency band
- an output connected to the reset system SRZ to provide thereto the control signal Sg.

The control element CTL presented in FIG. 4 is only an exemplary embodiment thereof.

Figure 6:
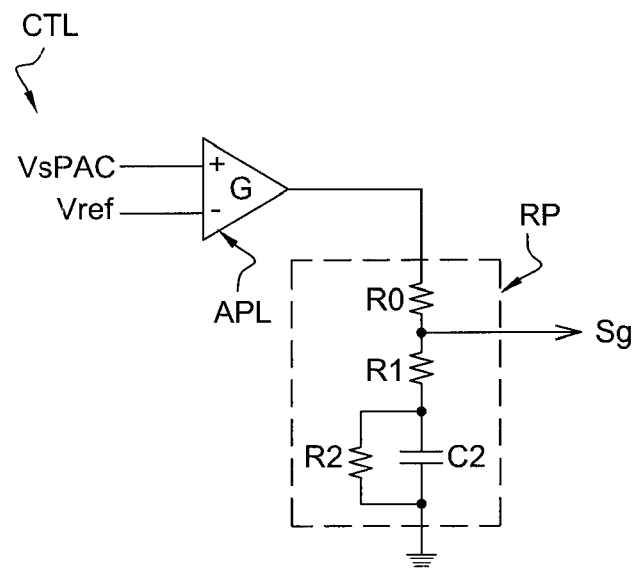

A second exemplary embodiment is given in FIG. 6. In this second embodiment, the control element CTL includes:
- an operational amplifier APL with a gain G, including:
  - a non-inverting terminal subjected to the voltage signal $V_{sPAC}$
  - an inverting terminal subjected to a reference voltage $V_{ref}$
  - an output connected to a passive network RP
- the passive network RP, including:
  - a first resistance R0, including a first terminal connected to the output of the operational amplifier APL, and a second terminal at which the control signal Sg is withdrawn
  - a second resistance R1, including a first terminal connected to the second terminal of the first resistance R0, and a second terminal
  - a third resistance R2 including a first terminal connected to the second terminal of the second resistance (R1), and a second terminal subjected to a zero voltage
  - a second capacitor C2, connected in parallel with the second resistance R2.

The transfer function, in the Laplace domain, associated with the control element CTL presented in FIG. 6 is as follows:

$$H(s) = \frac{Sg}{VsPAC - Vref} = \frac{G(R1 + R2)}{R0 + R1 + R2} \frac{1 + s\frac{R1R2C2}{R1 + R2}}{1 + s\frac{(R0 + R1)R2C2}{R0 + R1 + R2}}$$

The transfer function includes a pole Tp and a zero Tz, such that:

$$\frac{Tp}{Tz} = \frac{(R0 + R1)(R1 + R2)}{R1(R0 + R1 + R2)}$$

This ratio can assume high values as a function of the values of the resistances. For example, if $R1=1\Omega$, $R0=R2=200\Omega$, then:

$$\frac{Tp}{Tz} = 100.75$$

At low frequencies, the gain of this transfer function tends to the static gain:

$$\frac{G(R1 + R2)}{R0 + R1 + R2}$$

At high frequencies, the gain of this transfer function tends to:

$$\frac{G\ R1}{R0 + R1}$$

Figure 7:
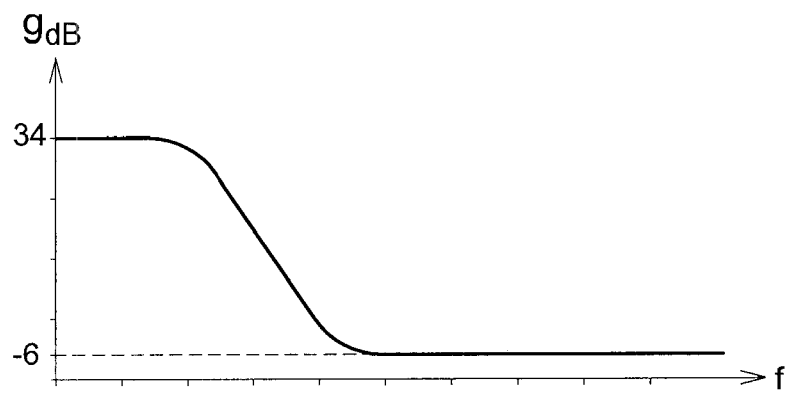

The Bode gain diagram of the control element CTL of FIG. 6 is represented in FIG. 7, for the following values: $R0=R2=2$ G$\Omega$, $R1=10$ M$\Omega$, $C2=10$ nF and $G=100$. At low frequencies, that is in static mode, that is in the absence of detection, the gain $g_{dB}$ of the control element is high. In the present case, it is 34 decibels. Then, from a certain frequency $f_1$, the gain $g_{dB}$ drops before being restored to a value lower than one, in the present case −6 decibels. The control element CTL thus behaves as an amplifier at low frequencies, and as an attenuator in a higher frequency band.

The invention claimed is:

1. A charge preamplifier for converting an electric charge generated in a charge source sensor into a voltage signal, comprising:
a phase inverting amplifier including an input related to the charge source sensor, and an output for providing the voltage signal;
a storage capacitor connected between the input and the output of the phase inverting amplifier;
a reset system connected to the input of the phase inverting amplifier, for providing to the storage capacitor a discharging current as a function of a control signal, and
a control element including:
a first input connected to the output of the phase inverting amplifier, for withdrawing the voltage signal,
a second input subjected to a reference voltage,
a set of components configured and arranged to generate a control signal proportional to the deviation between the voltage signal and the reference voltage, said proportionality coefficient being lower than one in a high frequency band, and an output connected to the reset system to provide thereto the control signal, wherein the control element includes a modified transconductance amplifier including a resistive element, a first field effect transistor of a first type, the gate and the drain of the first transistor being connected with each other, a second field effect transistor of the same type as the first transistor the sources of the first transistor and the second transistor being at a same fixed potential, the gates of the first transistor and the second transistor being connected via the resistive element, and a capacitor connected between the gate and the drain of the second transistor.

2. The charge preamplifier according to claim 1, wherein said proportional coefficient is higher than one for low frequencies.

3. The charge preamplifier according to claim 1, wherein the resistive element includes a second transconductance amplifier, biased by a low current.

4. The charge preamplifier according to claim 1, wherein the control element includes:

a D.C. current source, a third field effect transistor of a complementary type to the first transistor, such that:

the drain of the third transistor is connected to the drain of the first transistor, the source of the third transistor is connected to the current source, the gate of the third transistor is subjected to the output voltage of the phase inverting amplifier, a fourth field effect transistor of a complementary type to the first transistor, such that:

the drain of the fourth transistor is connected to the drain of the second transistor, the source of the third transistor is connected to the current source, the gate of the third transistor is subjected to the reference voltage.

5. A charge preamplifier for converting an electric charge generated in a charge source sensor into a voltage signal, comprising:

a phase inverting amplifier including an input related to the charge source sensor, and an output for providing the voltage signal;

a storage capacitor connected between the input and the output of the phase inverting amplifier;

a reset system connected to the input of the phase inverting amplifier, for providing to the storage capacitor a discharging current as a function of a control signal, and a control element including:

a first input connected to the output of the phase inverting amplifier, for withdrawing the voltage signal, a second input subjected to a reference voltage, a set of components configured and arranged to generate a control signal proportional to the deviation between the voltage signal and the reference voltage, said proportionality coefficient being lower than one in a high frequency band, an output connected to the reset system to provide thereto the control signal, wherein the control element includes:

an operational amplifier, including:

a non-inverting terminal subjected to the voltage signal, an inverting terminal subjected to the reference voltage, an output connected to a passive network, the passive network including:

a first resistance, including a first terminal connected to the output of the operational amplifier, and a second terminal at which the voltage signal is withdrawn a second resistance, including a fist terminal connected to the second terminal of the first resistance, and a second terminal a third resistance including a first terminal connected to the second terminal of the second resistance and a second terminal subjected to a zero voltage a second capacitor, connected in parallel with the second resistance.

6. The charge preamplifier according to claim 1, wherein the reset system includes a field effect transistor the source of which is subjected to the control signal.

7. The charge preamplifier according to claim 1, wherein the reset system includes a bipolar transistor the emitter of which is subjected to the control signal.

8. The charge preamplifier according to claim 1, wherein the reset system is biased by a leakage current of the sensor.

\* \* \* \* \*